United States Patent
Jain et al.

(10) Patent No.: US 11,513,883 B2
(45) Date of Patent: Nov. 29, 2022

(54) GLITCH ABSORPTION APPARATUS AND METHOD

(71) Applicant: STMicroelectronics International N.V., Geneva (CH)

(72) Inventors: Charul Jain, Delhi (IN); Asif Rashid Zargar, Greater Noida (IN)

(73) Assignee: STMicroelectronics International N.V., Geneva (CH)

(*) Notice: Subject to any disclaimer, the term of this patent is extended or adjusted under 35 U.S.C. 154(b) by 24 days.

(21) Appl. No.: 17/161,832

(22) Filed: Jan. 29, 2021

(65) Prior Publication Data
US 2022/0245011 A1    Aug. 4, 2022

(51) Int. Cl.
*G06F 11/07* (2006.01)

(52) U.S. Cl.
CPC ........ *G06F 11/079* (2013.01); *G06F 11/0724* (2013.01); *G06F 11/0751* (2013.01); *G06F 11/0775* (2013.01)

(58) Field of Classification Search
CPC ............... G06F 11/079; G06F 11/0724; G06F 11/0751; G06F 11/0775
See application file for complete search history.

(56) References Cited

U.S. PATENT DOCUMENTS

| | | | |
|---|---|---|---|
| 5,506,809 A | 4/1996 | Csoppenszky et al. | |
| 5,537,655 A | 7/1996 | Truong | |
| 7,366,948 B2 | 4/2008 | Michaelis et al. | |
| 8,156,371 B2* | 4/2012 | Oliver | G06F 11/1687 714/11 |
| 10,831,628 B2 | 11/2020 | Santoni et al. | |
| 2005/0240829 A1* | 10/2005 | Safford | G06F 11/165 714/E11.063 |
| 2009/0217092 A1 | 8/2009 | Weiberle et al. | |
| 2016/0283314 A1* | 9/2016 | Thanner | G06F 11/0793 |
| 2019/0114243 A1* | 4/2019 | Santoni | G06F 11/1641 |

FOREIGN PATENT DOCUMENTS

WO    2020129119 A1    6/2020

* cited by examiner

*Primary Examiner* — Nadeem Iqbal
(74) *Attorney, Agent, or Firm* — Slater Matsil, L.L.P.

(57) ABSTRACT

An apparatus includes a primary processor and a secondary processor configured to receive a first signal, a second signal and a plurality of input signals, and perform same operations as each other based on the first signal, the second signal and the plurality of input signals, a comparison circuit configured to receive output signals of the primary processor and the secondary processor, and detect a lockstep mismatch between the primary processor and the secondary processor based on the output signals, a fault capturing circuit configured to receive the first signal and the second signal, and capture a fault signal generated by the comparison circuit, and a first glitch absorption device configured to receive the first signal and the second signal, and absorb glitches fed into the first glitch absorption device.

20 Claims, 3 Drawing Sheets

GLITCH ABSORPTION APPARATUS AND METHOD

TECHNICAL FIELD

The present invention relates generally to a glitch absorption apparatus and method in a dual-core lockstep system.

BACKGROUND

As the automotive industry continues to expand, and the volume of automobiles increases, there is a growing need for System-on-Chip (SoC) semiconductor devices designed for safety-critical applications. Reliability is a critical concern for meeting the safety requirements of a range of automotive applications including advanced driver assistance systems, electric power steering systems, adaptive cruise control systems, braking control systems and the like.

In the safety-critical applications, a system error may occur in a computer system. If this system error is not detected and promptly corrected, it may cause hangs and crashes in the computer system. A dual-core lockstep computer system is employed to detect the system error so as to prevent the computer system crashes from occurring.

The dual-core lockstep computer system comprises a primary hardware block (e.g., a primary processor) and a secondary hardware block (e.g., a secondary processor) configured to operate in lockstep. Both the primary processor and the secondary processor are configured to receive the same input data and execute the same instruction of a same program code at any given time. After execution of every instruction, the result from the primary processor is compared with the result of the secondary processor. If any mismatch is found in the results of these two processors, it indicates there is a fault in the computer system. Consequently, the computer system enters into a defined safe mode.

In the dual-core lockstep system, a reset function is employed to bring the logic to a predetermined state. The reset function may be either synchronous or asynchronous relative to the clock signal. Since the asynchronous reset does not have clock related latency, the asynchronous reset may be used to achieve a faster data path. The asynchronous reset, however, has some drawbacks. For example, with asynchronous reset, unintended glitches may be generated during the reset assertion process. The unintended glitches may propagate into various logic circuits of the dual-core lockstep system, thereby causing a fake failure. Such a fake failure may result in reliability issues in the dual-core lockstep system. It is desirable to have a simple and reliable glitch absorption apparatus to keep the dual-core lockstep system to operate reliably.

SUMMARY

In accordance with an embodiment, an apparatus comprises a primary processor and a secondary processor configured to receive a first signal, a second signal and a plurality of input signals, and perform same operations as each other based on the first signal, the second signal and the plurality of input signals, a comparison circuit configured to receive output signals of the primary processor and the secondary processor, and detect a lockstep mismatch between the primary processor and the secondary processor based on the output signals, a fault capturing circuit configured to receive the first signal and the second signal, and capture a fault signal generated by the comparison circuit, and a first glitch absorption device configured to receive the first signal and the second signal, and absorb glitches fed into the first glitch absorption device.

In accordance with another embodiment, a method comprises placing a first glitch absorption device at an end of a fault signal path in a local system before a fault signal is sent to a global system, wherein the local system and the global system have different clock and reset signals, and absorbing, by the first glitch absorption device, glitches fed into the first glitch absorption device.

In accordance with yet another embodiment, a system comprises a glitch absorption device configured to absorb glitches on a fault signal, the glitch absorption device being placed at an end of a fault signal path in a local fault collector circuit before the fault signal is sent to a global fault collector circuit, a primary processor and a secondary processor configured to receive a clock signal, a reset signal and a plurality of input signals, and perform same operations as each other based on the clock signal, the reset signal and the plurality of input signals, and a comparison circuit configured to receive output signals of the primary processor and the secondary processor, and detect whether the output signal of the primary processor matches the output signal of the secondary processor based on the output signals.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of embodiments of this disclosure are discussed in detail below. It should be appreciated, however, that the concepts disclosed herein can be embodied in a wide variety of specific contexts, and that the specific embodiments discussed herein are merely illustrative and do not serve to limit the scope of the claims. Further, it should be understood that various changes, substitutions and alterations can be made herein without departing from the spirit and scope of this disclosure as defined by the appended claims.

The present disclosure will be described with respect to preferred embodiments in a specific context, namely a glitch absorption apparatus in a dual-core lockstep system. The present disclosure may also be applied, however, to a variety of safety-critical applications. Hereinafter, various embodiments will be explained in detail with reference to the accompanying drawings.

Figure 1:
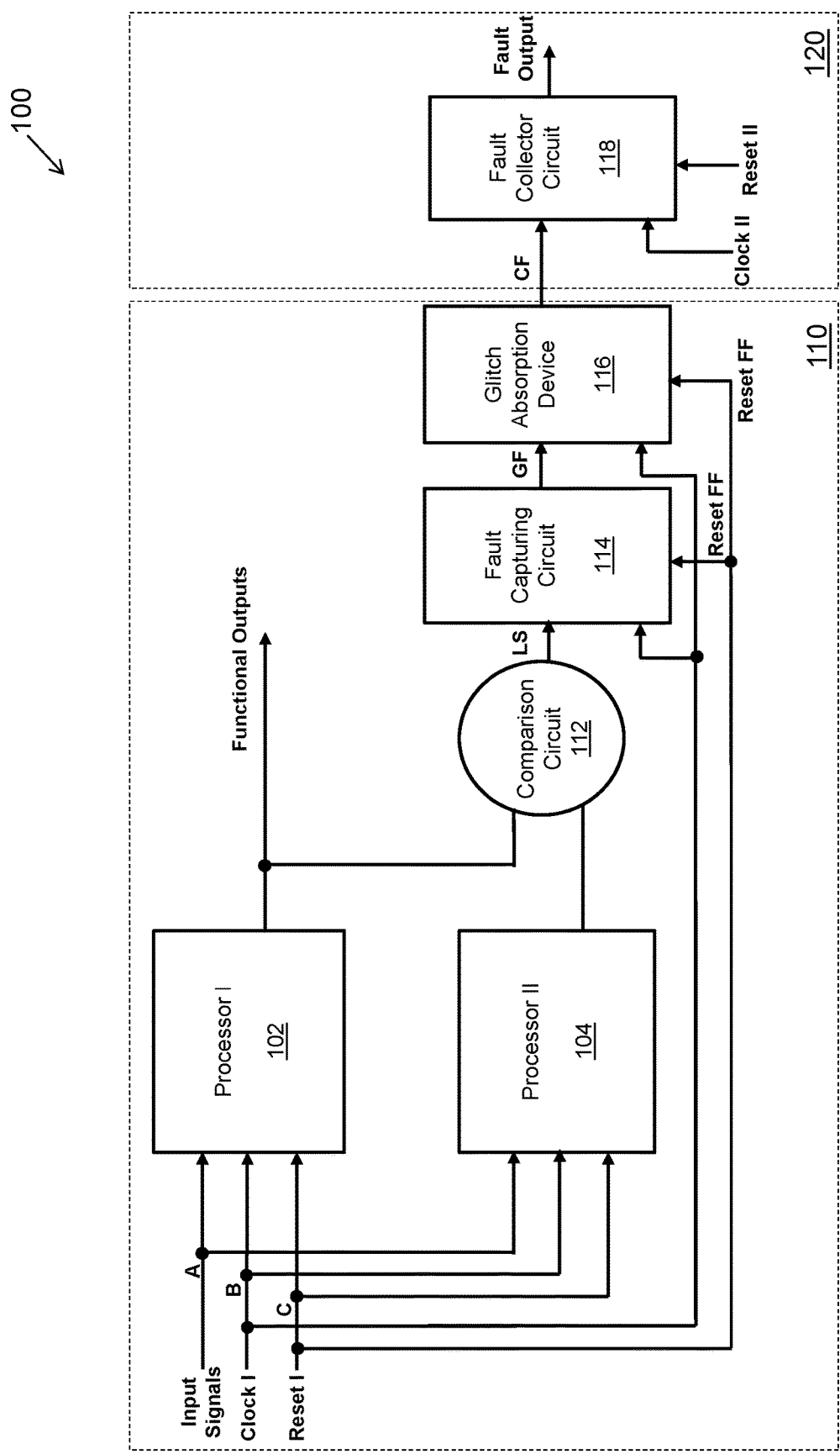
FIG. 1 illustrates a block diagram of a dual-core lockstep system having a glitch absorption device in accordance with various embodiments of the present disclosure.

FIG. 1 illustrates a block diagram of a dual-core lockstep system having a glitch absorption device in accordance with various embodiments of the present disclosure. A semiconductor chip 100 may comprises a plurality of dual-core lockstep systems and a global fault collection system 120. For simplicity, only one dual-core lockstep system (e.g., dual-core lockstep system 110) is illustrated in FIG. 1. Each dual-core lockstep system may generate a fault signal in response to a fault (e.g., a lockstep mismatch). Each dual-core lockstep system may comprise a local fault collector circuit. The local fault collector circuit detects a fault (e.g., a lockstep mismatch) in the dual-core lockstep system, and sends a fault signal to the global fault collection system. The global fault collection system 120 is employed to receive various fault signals generated by the plurality of dual-core lockstep systems. Throughout the description, the dual-core lockstep system 110 may be alternatively referred to as a local system. The global fault collection system 120 may be alternatively referred to as a global system.

The dual-core lockstep system 110 comprises a first processor 102, a second processor 104, a comparison circuit 112, a fault capturing circuit 114 and a glitch absorption device 116. The dual-core lockstep system 110 is configured to receive a first clock signal (Clock I), a first reset signal (Reset I) and a plurality of input signals. Based on the received signals, the dual-core lockstep system 110 generates a plurality of functional output signals.

The first clock signal is generated by a clock generator (not shown). The first clock signal is employed to condition a plurality of intellectual property (IP) components (e.g., communication IP, timer IP and memory IP). It should be noted that FIG. 1 illustrates only one clock signal for the dual-core lockstep system 110. It is merely an example. The dual-core lockstep system 110 may include a plurality of clock signals. The clock signal illustrated herein is limited solely for the purpose of clearly illustrating the inventive aspects of the various embodiments.

The first reset signal is employed to reset different parts of the dual-core lockstep system 110 before the start of functional operation. It should be noted that FIG. 1 illustrates only one reset signal for the dual-core lockstep system 110. It is merely an example. Depending on design needs, the dual-core lockstep system 110 may include a plurality of reset signals.

The input signals may be data signals. Alternatively, the input signals may be test signals. The test signals are used when the dual-core lockstep system 110 is configured to operate in a test mode. The data signals are used when the dual-core lockstep system 110 is configured to operate in a functional mode. The data signals are generated by a variety of IPs and fed into the first processor 102 and second processor 104, respectively. The first processor 102 processes the data signals and feed the processed data signals to a plurality of IPs connected to the output of the first processor 102.

As shown in FIG. 1, the plurality of input signals flows through a common signal path. At a node A, the plurality of input signals flows into two different signal paths coupled to the first processor 102 and the second processor 104, respectively. The first clock signal flows through a common signal path. At a node B, the first clock signal flows into two different signal paths coupled to the first processor 102 and the second processor 104, respectively. Likewise, the first reset signal flows through a common signal path. At a node C, the first reset signal flows into two different signal paths coupled to the first processor 102 and the second processor 104, respectively.

In some embodiments, the first processor 102 and the second processor 104 are two identical processors. These two processors are reset in the same states and fed with identical input signals. If these two processors operate correctly, identical outputs are generated by these two processors. In operation, a failure may occur and reach the output of one of these two processors. This failure can be detected by comparing the outputs of the two processors. After detecting such a failure, the dual-core lockstep system 110 may take appropriate actions to handle the failure so as to prevent the system from being crashed. In some embodiments, the first processor 102 is configured to perform the system operations. The second processor 104 is configured to confirm the correctness of the operation of the first processor 102. Throughout the description, the first processor 102 may be alternatively referred to as a primary processor 102. The second processor 104 may be referred to as a secondary processor 104.

The comparison circuit 112 has a first input coupled to the output of the primary processor 102, a second input coupled to the output of the secondary processor 104, and output (LS) coupled to an input of the fault capturing circuit 114. In some embodiments, the comparison circuit 112 is implemented as an XOR gate. The comparison circuit 112 is configured to compare an output signal of the primary processor 102 with an output signal of the secondary processor 104, and detect whether the output signal of the primary processor 102 matches the output signal of the secondary processor 104. If any mismatch is found in the results of these two processors, there is a fault in the dual-core lockstep system 110. Consequently, the dual-core lockstep system 110 enters into a defined safe mode.

In operation, when the output signal of the primary processor 102 matches the output signal of the secondary processor 104, the XOR gate generates an output signal having a logic low state. On the other hand, when the output signal of the primary processor 102 does not match the output signal of the secondary processor 104, the XOR gate generates an output signal having a logic high state.

The fault capturing circuit 114 has an input coupled to the output of the comparison circuit 112 and an output (GF) coupled to the input of the glitch absorption device 116. In some embodiments, the fault capturing circuit 114 comprises a D-type flip-flop. This D-type flip-flop is employed to generate a fault signal based on the output signal of the comparison circuit 112. As shown in FIG. 1, the fault capturing circuit 114 is configured to receive the output signal of the comparison circuit 112, the first clock signal and a delayed first reset signal (Reset FF). The fault capturing circuit 114 is configured to generate a fault signal when the XOR gate generates an output signal having a logic high state. The delayed first reset signal is similar to the first reset signal except that there is a delay (shown in FIG. 2) between these two signals.

In some embodiments, the comparison circuit 112 and the fault capturing circuit 114 form a local fault collector circuit. As shown in FIG. 1, the local fault collector circuit detects a fault and forwards a fault signal to the global fault collector circuit 118 through the glitch absorption device 116. In other words, the glitch absorption device 116 is placed at an end of a fault signal path in a local fault collector circuit before the fault signal is sent to a global fault collector circuit.

The glitch absorption device 116 has an input coupled to the output of fault capturing circuit 114 and an output (CF) coupled to the input of the fault collector circuit 118. In some embodiments, the glitch absorption device 116 comprises a D-type flip-flop. This D-type flip-flop is employed to absorb glitches on the output signal generated by the fault capturing circuit 114. As shown in FIG. 1, the glitch absorption device 116 is configured to receive the output signal of the fault capturing circuit 114, the first clock signal and the delayed first reset signal. The glitch absorption device 116 is configured to absorb glitches on the fault signal. The detailed operating principle of the glitch absorption device 116 will be discussed below with respect to FIG. 2.

It should be recognized that while FIG. 1 illustrates one glitch absorption device, any number of glitch absorption devices could be used to further improve the glitch absorption capability. In particular, when the reset assertion has been cleaned for timing as a multi-cycle path, the path can have a delay of more than one clock cycle. In this situation, a plurality of glitch absorption devices (e.g., two glitch absorption devices) may be connected in series to effectively absorb glitches caused by a long reset assertion propagation delay (e.g., the duration of the reset assertion propagation delay is greater than one clock cycle).

In some embodiments, the fault collector circuit 118 comprises a D-type flip-flop. This D-type flip-flop is employed to receive the fault signal generated by the dual-core lockstep system 110. As shown in FIG. 1, the fault collector circuit 118 is configured to receive the output signal of the glitch absorption device 116, a second clock signal (Clock II) and a second reset signal (Reset II). It should be noted the clock and reset signals of the fault collector circuit 118 are different from the clock and reset signals of the dual-core lockstep system 110.

Figure 2:
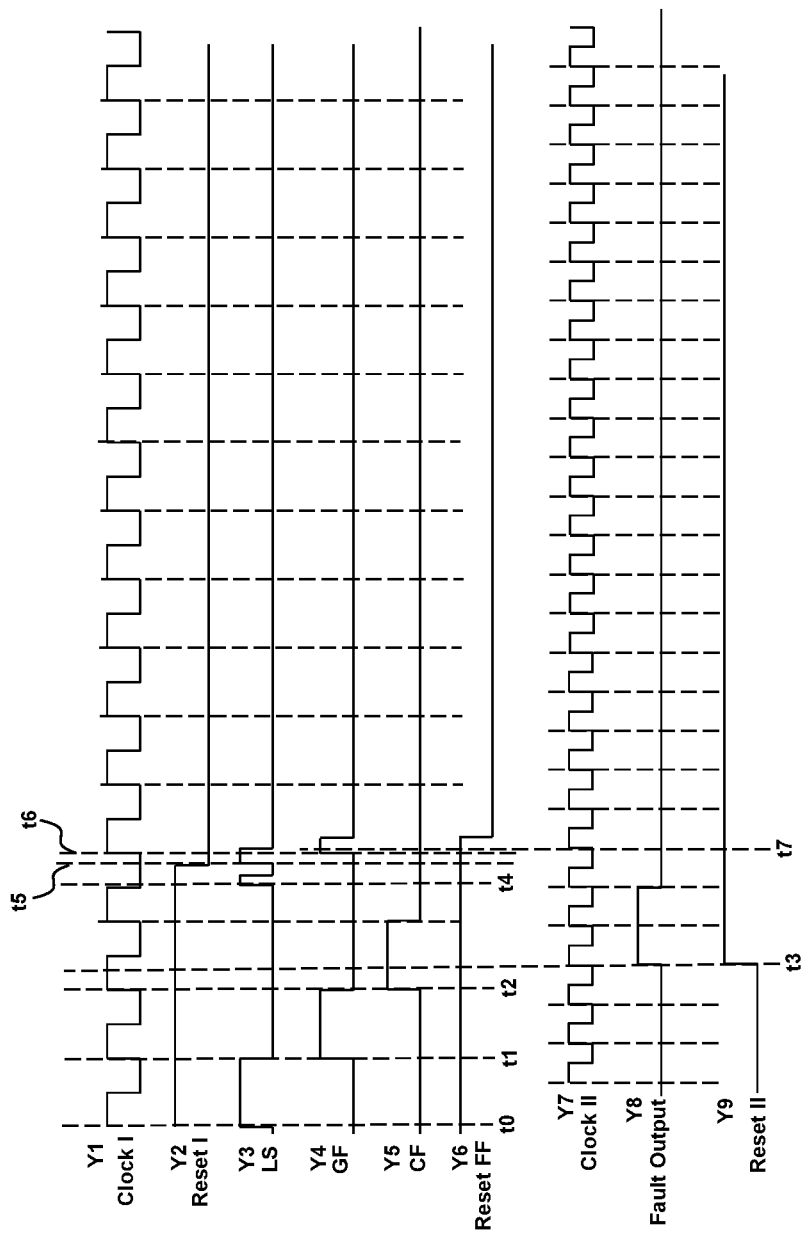
FIG. 2 illustrates a timing diagram of the dual-core lockstep system shown in FIG. 1 in accordance with various embodiments of the present disclosure.

FIG. 2 illustrates a timing diagram of the dual-core lockstep system shown in FIG. 1 in accordance with various embodiments of the present disclosure. The horizontal axis of FIG. 2 represents intervals of time. There are nine vertical axes. The first vertical axis Y1 represents the first clock signal (Clock I). The second vertical axis Y2 represents the first reset signal (Reset I). The third vertical axis Y3 represents the output signal (LS) of the comparison circuit 112. The fourth vertical axis Y4 represents the output signal (GF) of the fault capturing circuit 114. The fifth vertical axis Y5 represents the output signal (CF) of the glitch absorption device 116. The six vertical axis Y6 represents the reset signal (Reset FF) applied to the fault capturing circuit 114 and the glitch absorption device 116. The seventh vertical axis Y7 represents the second clock signal (Clock II). The eighth vertical axis Y8 represents the fault output signal generated by the fault collector circuit 118. The ninth vertical axis Y9 represents the second reset signal (Reset II).

At the time instant t0, the comparison circuit 112 generates a signal having a logic high state. This is a valid fault signal. As shown in FIG. 2, the valid fault signal extends over one clock cycle. After one clock cycle, at the time instant t1, the fault capturing circuit 114 captures this logic high state and generates a fault signal in response to the logic high state of the output signal of the comparison circuit 112. After another clock cycle, at the time instant t2, the glitch absorption device 116 generates a fault signal similar to that generated by the fault capturing circuit 114 except that there is a delay between the fault signals generated by the glitch absorption device 116 and the fault capturing circuit 114. Referring back to FIG. 1, the glitch absorption device 116 sends the fault signal to the fault collector circuit 118. At the next clock cycle of the global system (time instant t3), the fault collector circuit 118 generates a fault signal (a logic high state).

In operation, reset assertion may generate a propagation delay. Such a propagation delay may cause the comparison circuit 112 to fail. In particular, glitches may occur on the output signal of the comparison circuit 112. As shown in FIG. 2, at the time instant t4, a first glitch occurs on the output signal of the comparison circuit 112. At the time instant t5, a second glitch occurs on the output signal of the comparison circuit 112. The first glitch is short. The fault capturing circuit 114 does not capture this glitch. The second glitch maintains a logic high stage at the leading edge of the next clock cycle (time instant t6). At the time instant t6, the fault capturing circuit 114 generates a fault signal in response to the logic high stage of the second glitch.

As shown in FIG. 2, the second glitch does not extend over one clock cycle. The second glitch is absorbed by the glitch absorption device 116. As shown in FIG. 2, since the second glitch has been absorbed, the glitch absorption device 116 does not generate a fault signal. At the time instant t7, the fault collector circuit 118 does not generate a fault signal. In other words, the glitch absorption device 116 has absorbed the glitches. As a result of having the glitch absorption device 116, the glitches do not have an impact on the operation of the dual-core lockstep system.

It should be recognized that while FIG. 2 illustrates two glitches on the output signal of the comparison circuit 112, any number of glitches could be generated on the output signal of the comparison circuit 112. The glitch absorption device 116 is able to absorb any number of glitches.

It should further be noted that the glitches shown in FIG. 2 are caused by the reset assertion propagation delay. As long as the duration of the reset assertion propagation delay is less than one clock cycle, the glitch can be safely filtered or absorbed by the glitch absorption device 116. In some embodiments, the duration of the reset assertion propagation delay is greater than one clock cycle. One additional glitch absorption device may be connected in series with the glitch absorption device 116 to prevent the glitch from propagating into the next stage.

Figure 3:
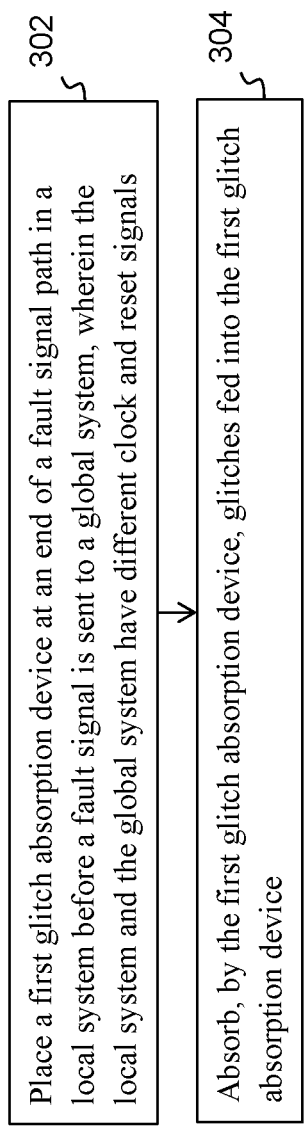
FIG. 3 illustrates a flow chart of a method for absorbing the glitches in the dual-core lockstep system shown in FIG. 1 in accordance with various embodiments of the present disclosure.

FIG. 3 illustrates a flow chart of a method for absorbing the glitches in the dual-core lockstep system shown in FIG. 1 in accordance with various embodiments of the present disclosure. This flowchart shown in FIG. 3 is merely an example, which should not unduly limit the scope of the claims. One of ordinary skill in the art would recognize many variations, alternatives, and modifications. For example, various steps illustrated in FIG. 3 may be added, removed, replaced, rearranged and repeated.

A dual-core lockstep system comprises a primary processor (e.g., processor I in FIG. 1) and a secondary processor (e.g., processor II in FIG. 1). Both the primary processor and the secondary processor are configured to receive the same input signals including a clock signal, a reset signal and a plurality of data signals.

The plurality of data signals flows through a common data signal path. At a first node (e.g., node A in FIG. 1), the plurality of data signals is routed to two different signal paths connected to the primary processor and the secondary processor, respectively.

It should be noted for controlling the timing of the plurality of data signals fed into the primary processor, a plurality of primary delay buffers may be placed in the signal path between the first node and the primary processor. For controlling the timing of the plurality of data signals fed into the secondary processor, a plurality of secondary delay buffers may be placed in the signal path between the first node and the secondary processor.

The clock signal flows through a common clock signal path. At a second node (e.g., node B in FIG. 1), the clock signal is routed to two different signal paths connected to the primary processor and the secondary processor, respectively.

It should be noted for controlling the timing of the clock signal fed into the primary processor, a plurality of primary delay buffers may be placed in the signal path between the second node and the primary processor. For controlling the timing of the clock signal fed into the secondary processor, a plurality of secondary delay buffers may be placed in the signal path between the second node and the secondary processor.

The reset signal flows through a common reset signal path. At a third node (e.g., node C in FIG. 1), the reset signal is routed to two different signal paths connected to the primary processor and the secondary processor, respectively.

It should be noted for controlling the timing of the reset signal fed into the primary processor, a plurality of primary delay buffers may be placed in the signal path between the third node and the primary processor. For controlling the timing of the reset signal fed into the secondary processor, a plurality of secondary delay buffers may be placed in the signal path between the third node and the secondary processor.

Both the primary processor and the secondary processor process the received signals. The output of the primary processor is compared with the output of the secondary processor at a comparison circuit (e.g., comparison circuit 112 shown in FIG. 1). The output of the comparison circuit determines whether the output signal of the primary processor matches the output signal of the secondary processor. If the outputs of these processors do not match to each other, it indicates there is a fault in the dual-core lockstep system. The dual-core lockstep system enters into a predetermined safe mode to prevent the propagation of the fault.

In operation, glitches may occur on the output signal of the comparison circuit. The conventional dual-core configuration prevents the glitches from being occurring through adding complex circuits into the dual-core lockstep system. In the various embodiments of the present disclosure, the following steps are employed to absorb the glitches occurred in the dual-core lockstep system.

At step 302, a first glitch absorption device (e.g., glitch absorption device 116 shown in FIG. 1) is placed at an end of a fault signal path in a local system before a fault signal is sent to a global system. The local system is a dual-core lockstep system. The global system comprises a fault collector circuit configured to receive fault signals from a plurality of dual-core lockstep systems. The local system and the global system have different clock and reset signals.

At step 304, the glitches fed into the first glitch absorption device is absorbed by first glitch absorption device. The first glitch absorption device is a D-type flip-flop. As shown in FIG. 2, the D-type flip-flop is able to absorb the glitches on the fault signal.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a primary processor and a secondary processor configured to receive a first signal, a second signal and a plurality of input signals, and perform same operations as each other based on the first signal, the second signal and the plurality of input signals;
a comparison circuit configured to receive output signals of the primary processor and the secondary processor, and detect a lockstep mismatch between the primary processor and the secondary processor based on the output signals;
a fault capturing circuit configured to receive the first signal and the second signal, and capture a fault signal generated by the comparison circuit; and
a first glitch absorption device configured to receive the first signal and the second signal, and absorb glitches fed into the first glitch absorption device.

2. The apparatus of claim 1, wherein
the first signal is a first clock signal; and
the second signal is a first reset signal.

3. The apparatus of claim 2, further comprising:
a fault collector circuit configured to receive a second clock signal and a second reset signal, the fault collector circuit being coupled to an output of the first glitch absorption device.

4. The apparatus of claim 3, wherein:
the fault collector circuit comprises a first D-type flip-flop.

5. The apparatus of claim 1, wherein:
the comparison circuit comprises an XOR gate.

6. The apparatus of claim 5, wherein:
the XOR gate has a first input coupled to an output of the primary processor, a second input coupled to an output of the secondary processor, and an output coupled to an input of the fault capturing circuit.

7. The apparatus of claim 1, wherein:
the fault capturing circuit comprises a second D-type flip-flop having an input coupled to an output of the comparison circuit, and an output coupled to an input of the first glitch absorption device.

8. The apparatus of claim 1, wherein:
the first glitch absorption device comprises a third D-type flip-flop having an input coupled to an output of the fault capturing circuit, and an output coupled to an input of a fault collector circuit.

9. The apparatus of claim 1, wherein:
the fault capturing circuit and the first glitch absorption device are placed immediately adjacent to each other in a layout of a dual-core lockstep system comprising the primary processor and the secondary processor.

10. The apparatus of claim 1, further comprising:
a second glitch absorption device connected in series with the first glitch absorption device.

11. A method comprising:
placing a first glitch absorption device at an end of a fault signal path in a local system before a fault signal is sent to a global system, wherein the local system and the global system have different clock and reset signals; and
absorbing, by the first glitch absorption device, glitches fed into the first glitch absorption device.

12. The method of claim 11, further comprising:
placing a second glitch absorption device connected in series with the first glitch absorption device.

13. The method of claim 11, wherein the local system comprises:
a primary processor and a secondary processor configured to receive a first clock signal, a first reset signal and a plurality of input signals, and perform same operations as each other based on the first clock signal, the first reset signal and the plurality of input signals;
a comparison circuit configured to receive output signals of the primary processor and the secondary processor;
a fault capturing circuit configured to receive the first clock signal and the first reset signal, and capture a fault signal generated by the comparison circuit; and
the first glitch absorption device configured to receive the first clock signal and the first reset signal, and absorb the glitches fed into the first glitch absorption device.

14. The method of claim 13, further comprising:
comparing, by the comparison circuit, an output signal of the primary processor with an output signal of the secondary processor; and
detecting whether the output signal of the primary processor matches the output signal of the secondary processor based on a comparing result of the step of comparing the output signal of the primary processor with the output signal of the secondary processor.

15. The method of claim 13, wherein:
the global system comprises a fault collector circuit coupled to an output of the first glitch absorption device, and wherein the fault collector circuit comprises a first D-type flip-flop.

16. The method of claim 13, wherein:
the fault capturing circuit comprises a second D-type flip-flop having an input coupled to an output of the comparison circuit, and an output coupled to an input of the first glitch absorption device; and
the first glitch absorption device comprises a third D-type flip-flop having an output coupled to an input of a fault collector circuit of the global system.

17. A system comprising:
a glitch absorption device configured to absorb glitches on a fault signal, the glitch absorption device being placed at an end of a fault signal path in a local fault collector circuit before the fault signal is sent to a global fault collector circuit;
a primary processor and a secondary processor configured to receive a clock signal, a reset signal and a plurality of input signals, and perform same operations as each other based on the clock signal, the reset signal and the plurality of input signals; and
a comparison circuit configured to receive output signals of the primary processor and the secondary processor, and detect whether the output signal of the primary processor matches the output signal of the secondary processor based on the output signals.

18. The system of claim 17, wherein:
the local fault collector circuit and the global fault collector circuit have different clock and reset signals.

19. The system of claim 17, further comprising:
a fault capturing circuit configured to receive the clock signal and reset signal, and capture a fault signal generated by the comparison circuit, wherein the fault capturing circuit is coupled between the comparison circuit and the glitch absorption device.

20. The system of claim 19, wherein:
the global fault collector circuit comprises a fault collector circuit coupled to an output of the glitch absorption device, and wherein the fault collector circuit comprises a first D-type flip-flop;
the fault capturing circuit comprises a second D-type flip-flop having an input coupled to an output of the comparison circuit, and an output coupled to an input of the glitch absorption device; and
the glitch absorption device comprises a third D-type flip-flop having an input coupled to the output of the fault capturing circuit, and an output coupled to an input of the fault collector circuit.

* * * * *